US012806716B2

(12) United States Patent
Cheng et al.

(10) Patent No.: US 12,806,716 B2
(45) Date of Patent: Nov. 24, 2026

(54) LASER SEALING AND SURFACE ASPERITY CONTROLLING METHOD WITH DISCONTINUOUS LASER PULSES

(71) Applicant: Robert Bosch GmbH, Stuttgart (DE)

(72) Inventors: Bo Cheng, Malden, MA (US); Holger Rumpf, Reutlingen (DE); Jens Frey, Filderstadt (DE); Charles Tuffile, Swansea, MA (US)

(73) Assignee: Robert Bosch GmbH, Stuttgart (DE)

( * ) Notice: Subject to any disclaimer, the term of this patent is extended or adjusted under 35 U.S.C. 154(b) by 1034 days.

(21) Appl. No.: 17/863,665

(22) Filed: Jul. 13, 2022

(65) Prior Publication Data

US 2024/0017353 A1 Jan. 18, 2024

(51) Int. Cl.

| | |
|---|---|
| ***B23K 26/20*** | (2014.01) |
| ***B23K 26/0622*** | (2014.01) |
| ***B23K 26/073*** | (2006.01) |
| ***B23K 26/354*** | (2014.01) |
| ***B81C 1/00*** | (2006.01) |
| *B23K 103/00* | (2006.01) |

(52) U.S. Cl.

CPC ........ *B23K 26/206* (2013.01); *B23K 26/0622* (2015.10); *B23K 26/073* (2013.01); *B23K 26/354* (2015.10); *B81C 1/00158* (2013.01); *B23K 2103/56* (2018.08)

(58) Field of Classification Search

CPC .............. B23K 26/0622; B23K 26/206; B23K 2101/36; B23K 2101/40; B23K 2101/42; B23K 2103/50; B23K 2103/54; B23K 2103/56; B23K 26/0006; B23K 26/06; B23K 26/0604; B23K 26/064; B23K 26/073; B23K 26/18; B23K 26/324; B23K 26/354

USPC .................................................... 219/121.65

See application file for complete search history.

(56) References Cited

U.S. PATENT DOCUMENTS

| | | | |
|---|---|---|---|
| 10,207,366 | B2 | 2/2019 | Ilin et al. |
| 2009/0140146 | A1 | 6/2009 | Sogawa et al. |

(Continued)

FOREIGN PATENT DOCUMENTS

| | | | |
|---|---|---|---|
| DE | 10 2015 224 488 | A1 | 6/2017 |
| WO | 2015120939 | A1 | 8/2015 |

OTHER PUBLICATIONS

DE102015224488A1 English translation (Year: 2015).*

(Continued)

*Primary Examiner* — Chris Q Liu

(74) *Attorney, Agent, or Firm* — Brooks Kushman P.C.

(57) ABSTRACT

A method for controlling surface asperity during laser sealing of a membrane vent hole. The method includes applying a laser having a laser intensity spatial distribution to the membrane vent hole to form a seal over the membrane vent hole. The seal has a seal surface. The laser pulse includes a primary laser pulse region and a secondary pulse region later in time than the primary laser pulse region, and a time gap between the primary laser pulse region and the secondary laser pulse region. The primary laser pulse region and/or the secondary pulse region include first and second discontinuous laser pulses having a first time gap therebetween and/or third and fourth discontinuous laser pulses having a second time gap therebetween. The seal surface has a controlled surface asperity characteristic.

15 Claims, 18 Drawing Sheets

(56) References Cited

U.S. PATENT DOCUMENTS

| | | | |
|---|---|---|---|
| 2012/0299127 A1 | 11/2012 | Fujii et al. | |
| 2013/0074596 A1 | 3/2013 | Takizawa | |
| 2017/0113920 A1 | 4/2017 | Reichenbach et al. | |
| 2017/0113921 A1 | 4/2017 | Breitling et al. | |
| 2017/0113923 A1 | 4/2017 | Reichenbach et al. | |
| 2017/0157710 A1* | 6/2017 | Ilin | B23K 26/324 |
| 2017/0158491 A1 | 6/2017 | Ilin et al. | |
| 2017/0158498 A1 | 6/2017 | Ametowobla et al. | |
| 2017/0158499 A1 | 6/2017 | Ametowobla et al. | |
| 2018/0312397 A1 | 11/2018 | Reinmuth et al. | |
| 2019/0098786 A1 | 3/2019 | Chida | |
| 2019/0369137 A1 | 12/2019 | Naruse | |
| 2020/0278376 A1 | 9/2020 | Nagata | |
| 2021/0025915 A1 | 1/2021 | Takizawa et al. | |
| 2022/0082581 A1 | 3/2022 | Takizawa | |
| 2024/0017349 A1 | 1/2024 | Cheng et al. | |

OTHER PUBLICATIONS

Menold, T. et al., "Surface patterning of monocrystalline silicon induced by spot laser melting," Journal of Applied Physics, vol. 124, No. 163104, Oct. 25, 2018, pp. 163104-1-163104-11, DOI: 10.1063/1.5049781.

International Search Report issued in PCT/EP2023/069040, mailed Oct. 9, 2023, 5 pages.

International Search Report issued in PCT/EP2023/069157, mailed Oct. 27, 2023, 4 pages.

* cited by examiner

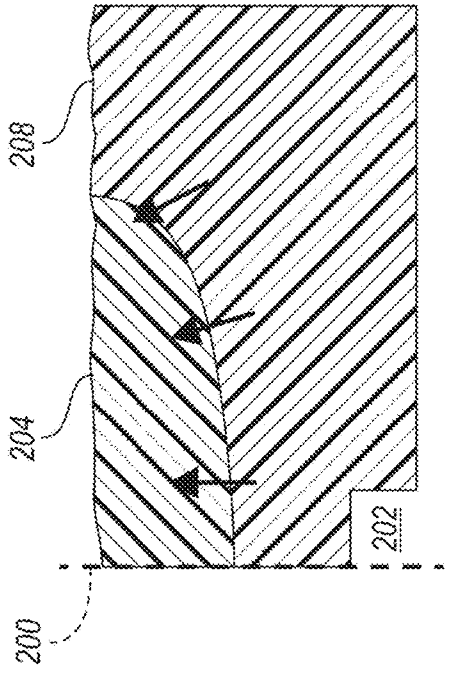
FIG. 6A1
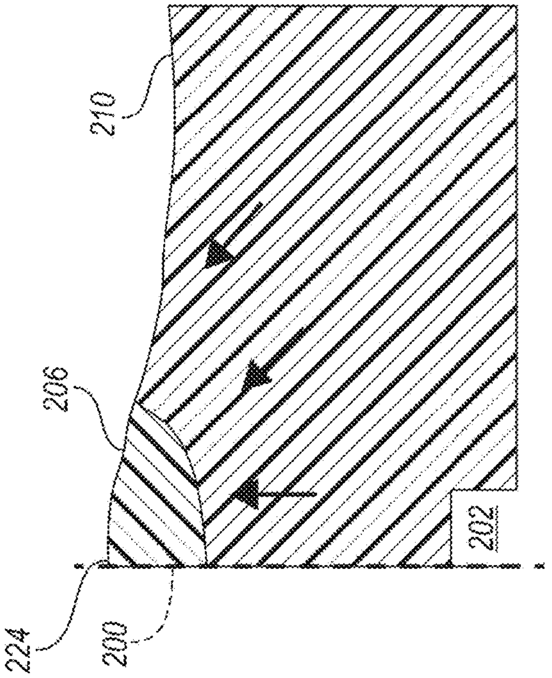
FIG. 6A2
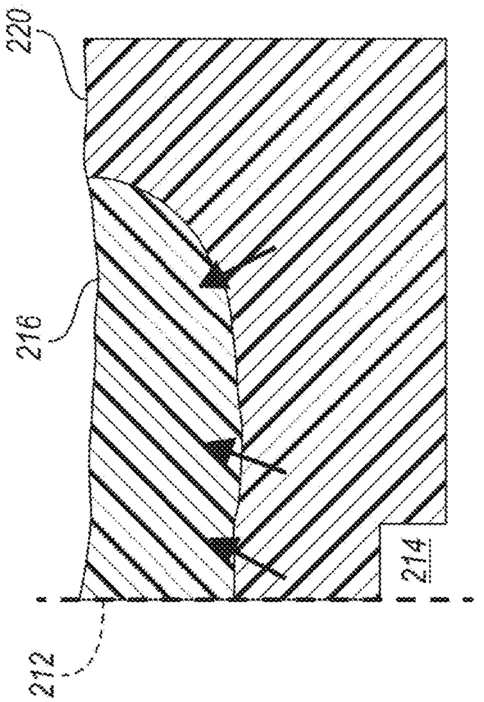
FIG. 6A3
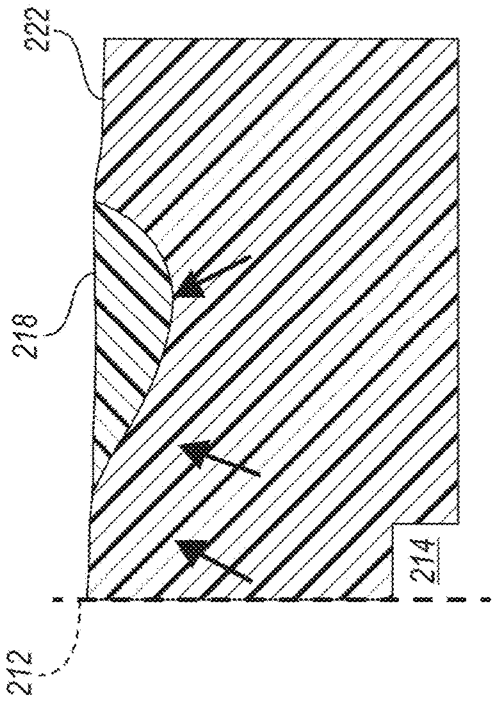
FIG. 6A4

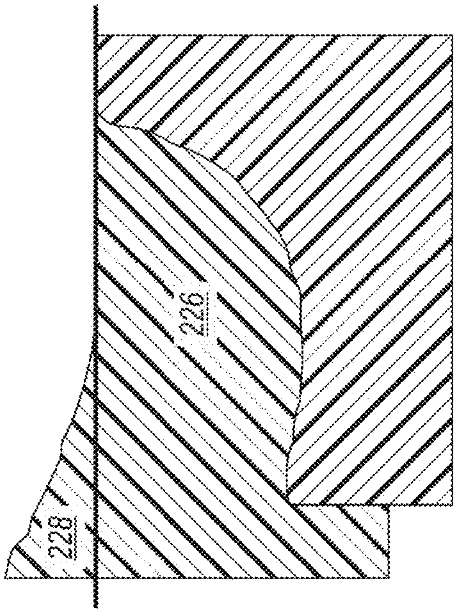
FIG. 6B1
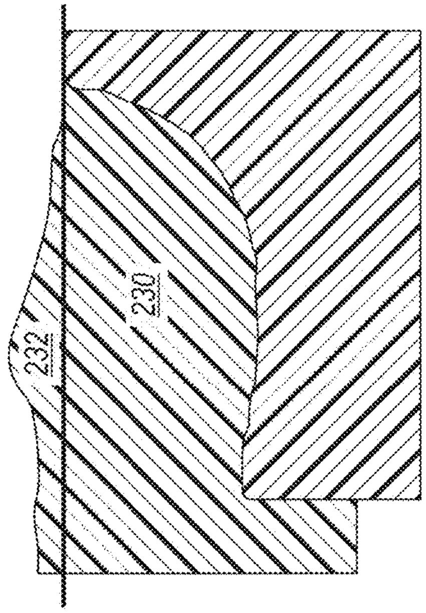
FIG. 6B3
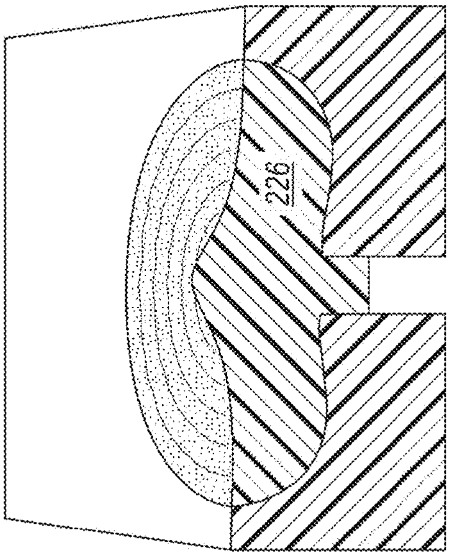
FIG. 6B2
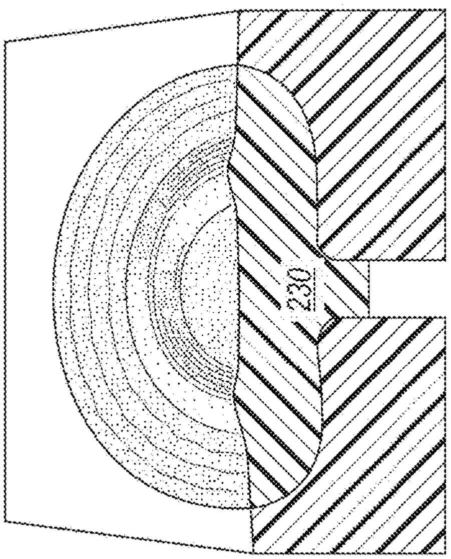
FIG. 6B4

LASER SEALING AND SURFACE ASPERITY CONTROLLING METHOD WITH DISCONTINUOUS LASER PULSES

TECHNICAL FIELD

The present disclosure relates to pulse laser irradiation techniques, and more specifically, laser sealing and surface asperity controlling methods for laser sealing of a membrane vent hole where the membrane may be formed of silicon and the methods may use discontinuous laser pulses.

BACKGROUND

A pulse laser irradiation technique has been recently proposed for sealing vent hole openings to form a seal zone in an inertial measurement unit (IMU) to capture critical sensor cavity pressures within a device. The vent hole is formed by deep reactive ion etching of a silicon membrane below which is a device chamber that contains a vacuum-level dependent micro-electromechanical system (MEMS) sensor. During the laser irradiation process, the seal zone quality can be significantly affected by complicated process physics, such as Marangoni flow and/or silicon phase changes. A solidified silicon topography can be problematic for IMU devices. For example, surface asperity may form rough edges on the surface of the seal zone. The removal of such structure may potentially damage the quality of the device.

SUMMARY

According to one embodiment, a method for controlling surface asperity during laser sealing of a membrane vent hole is disclosed. The method includes applying a laser having a laser intensity spatial distribution to the membrane vent hole to form a seal over the membrane vent hole. The seal has a seal surface. The laser pulse includes a primary laser pulse region and a secondary pulse region later in time than the primary laser pulse region, and a time gap between the primary laser pulse region and the secondary laser pulse region. The primary laser pulse region and/or the secondary pulse region include first and second discontinuous laser pulses having a first time gap therebetween and/or third and fourth discontinuous laser pulses having a second time gap therebetween. The seal surface has a controlled surface asperity characteristic.

According to another embodiment, a method for controlling surface asperity during laser sealing of a membrane vent hole is disclosed. The method includes applying a laser pulse having a laser intensity spatial distribution to the membrane vent hole to form a seal over the membrane vent hole. The seal has a seal surface. The laser pulse includes a primary laser pulse region and a secondary laser pulse region later in time than the primary laser pulse region, and a time gap between the primary laser pulse region and the secondary laser pulse region. The primary laser pulse region has a primary laser power and the secondary laser pulse region has a secondary laser power. The secondary laser power is less than the primary laser power. The seal surface has a controlled surface asperity characteristic.

According to yet another embodiment, a method for controlling surface asperity during laser sealing of a membrane vent hole is disclosed. The method includes applying a laser pulse having a laser intensity spatial distribution on the membrane vent hole to form a seal over the membrane vent hole. The seal has a seal surface. The laser pulse includes a primary laser pulse region and a secondary laser pulse region later in time than the primary laser pulse region. The seal surface has a controlled solidification path where the secondary laser pulse region applies heat to a molten zone formed by the primary laser pulse region, thereby moving molten material from a center of the membrane vent hole outward therefrom.

BRIEF DESCRIPTION OF THE DRAWINGS

FIGS. 6A1 and 6A2 depict cross-sectional views of a first material solidification path after the application of a laser heat source according to a first case taken at a first time and a later second time.

FIGS. 6A3 and 6A4 depict cross-sectional views of a second material solidification path after the application of a laser heat source according to a second case taken at a first time and a later second time.

FIG. 6B1 depicts a magnified, cross-sectional view of a first material solidification path after solidification according to a first case taken at a third time.

FIG. 6B2 depicts a cross-sectional, perspective view of a first material solidification path after the application of the laser heat source according to the first case taken at the third time.

FIG. 6B3 depicts a magnified, cross-sectional view of a second solidification path after solidification according to the second case taken at a third time.

FIG. 6B4 depicts a cross-sectional, perspective view of the second material solidification path after the application of the laser heat source according to the second case taken at the third time.

DETAILED DESCRIPTION

Figure 1A:
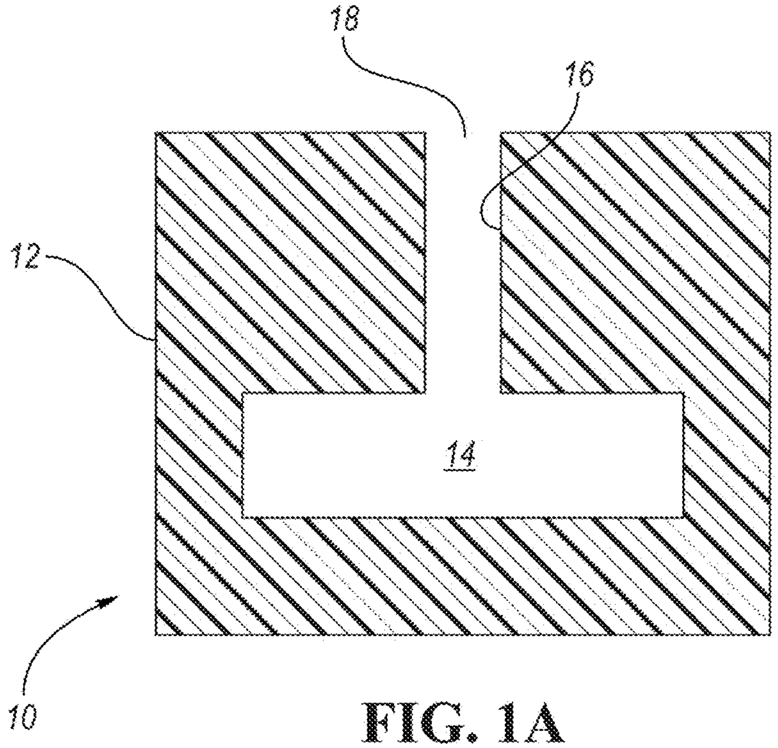
FIG. 1A depicts a cross-sectional view of device formed with a silicon membrane.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the term "polymer" includes "oligomer," "copolymer," "terpolymer," and the like; the description of a group or class of materials as suitable or preferred for a given purpose in connection with the invention implies that mixtures of any two or more of the members of the group or class are equally suitable or preferred; molecular weights provided for any polymers refers to number average molecular weight; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

This invention is not limited to the specific embodiments and methods described below, as specific components and/or conditions may, of course, vary. Furthermore, the terminology used herein is used only for the purpose of describing embodiments of the present invention and is not intended to be limiting in any way.

As used in the specification and the appended claims, the singular form "a," "an," and "the" comprise plural referents unless the context clearly indicates otherwise. For example, reference to a component in the singular is intended to comprise a plurality of components.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

In one or more embodiments, a method to reduce surface asperity of seal zones in laser sealing of silicon membranes is disclosed. One or more embodiments rely on a computational fluid dynamics (CFD) model to simulate a laser used in a silicon membrane sealing process. Complicated process physics such as surface tension and/or solidification volume shrinkage are considered in the CFD model. Temperature dependent material properties, such as density, conductivity, specific heat and/or surface tension coefficient, may be included in the CFD model to improve simulation accuracy.

In one or more embodiments, a continuous laser pulse with defined primary and secondary pulse regions are used to promote reduction in surface asperity. The laser intensity spatial distribution of the primary and/or secondary pulse regions may be donut shaped with a rectangular or Gaussian cross-section. The power of the secondary laser pulse region may be lower than the primary laser pulse region by a percentage (e.g., in a range of 10% to 60%).

In one or more embodiments, in systems using first and second individual and time-separated laser pulse regions, a secondary laser pulse may be applied with an appropriate time gap (e.g., a time value between primary and supplementary laser pulses) to reduce surface asperity. The surface asperity reduction effect may be increased by reducing the time gap. Conversely, the surface asperity reduction effect may be decreased by increasing the time gap.

In one or more embodiments, a variable vent hole diameter or perimeter may be used to reduce surface asperity.

Figure 1B:
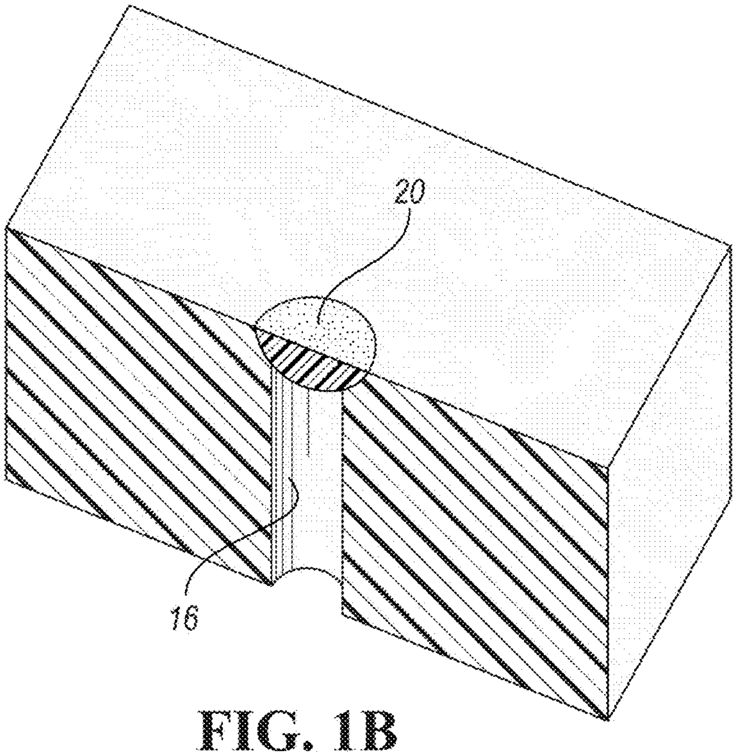
FIG. 1B depicts a cross-sectional, perspective, isolated view of a portion of a vent hole within the device.

A pulse laser irradiation technique may be utilized to seal a vent hole opening in an inertial measurement unit (IMU). The IMU is configured to capture critical sensor cavity pressures within a device. FIG. 1A depicts a cross-sectional view of device 10 formed of material 12 (e.g., a silicon membrane). The material 12 defines device chamber 14 and vent hole 16. Vent hole 16 terminates at vent hole opening 18. Vent hole 16 extends between device chamber 14 and vent hole opening 18. FIG. 1B depicts a cross-sectional, perspective, isolated view of a portion of vent hole 16 within device 10. FIG. 1B depicts seal 20 configured to seal vent hole opening 18. Seal zone 18 is formed via a laser irradiation process.

When material 12 is a silicon membrane, vent hole 16 is formed by chemical etching of a silicon (Si) membrane below which device chamber 14 containing a pressure-sensitive micro-electromechanical system (MEMS) sensor. During the laser irradiation process, the silicon in the seal zone melts, flows, and resolidifies, during which the seal quality can be significantly affected by complicated process physics, such as Marangoni flow and Si phase changes. As the molten silicon solidifies, the volume increases, thereby reducing the density, resulting in the formation of a peak-shaped surface asperity. The peak-shaped surface asperity may be problematic for IMU devices with adjacent devices built on top of the IMU.

Figure 1C:
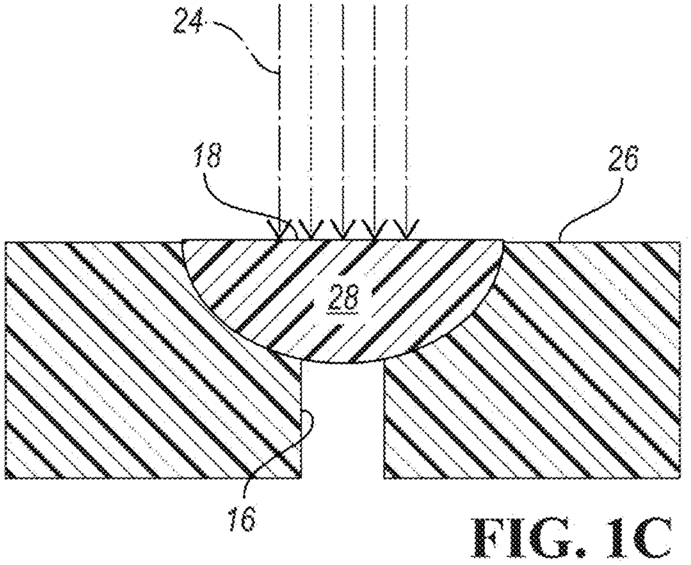
FIGS. 1C and 1D show schematic side views of a laser irradiation process performed on the vent hole opening in a melted state and a solidified state, respectively.
Figure 1D:
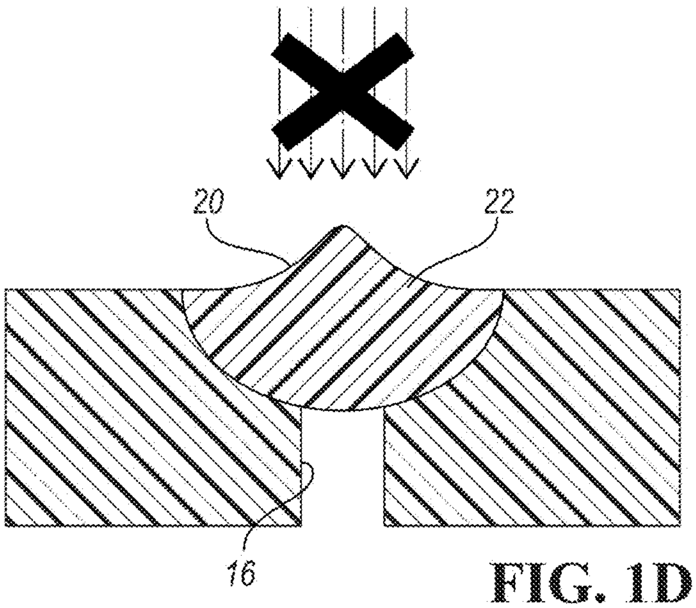

FIGS. 1C and 1D show a schematic side view of a laser irradiation process performed on vent hole opening 18 in a melted state and a solidified state, respectively. The laser irradiation process forms seal 20, which has a surface abnormality shown in FIG. 1D. As shown in FIG. 1C, laser pulse 24 with a pulse duration is used to irradiate top surface 26 of the silicon membrane adjacent to vent hole 16. The material under irradiated region 28 starts to melt and flow to fill vent hole 16. After laser pulse 24 is turned off, as shown in FIG. 1D, the molten silicon solidifies and seals vent hole 16. However, as shown in FIG. 1D, surface asperity 22 is formed on seal 20. The reason for surface asperity formation may be based on the specific physical property of silicon material (e.g., the silicon material has a larger liquid density than solid density around its melting temperature).

Figure 2:
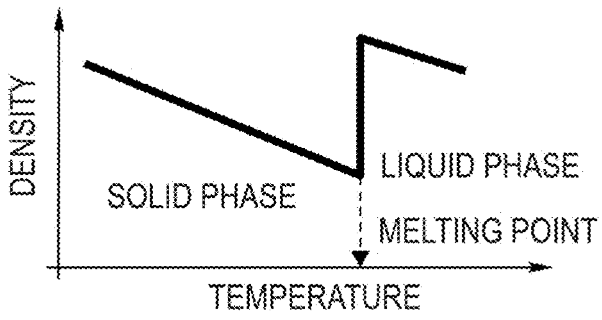
FIG. 2 is a graph plotting a density versus temperature curve for silicon.

FIG. 2 is a graph plotting a density versus temperature curve for silicon. As shown in FIG. 2, silicon has a larger liquid density than solid density around its melting temperature. The silicon material volume shrinkage and expansion during melting and solidification may eventually contribute to the surface asperity formation.

One proposal involves mechanically removing solidified silicon asperity. However, mechanical removal may present risk of failure of the brittle hermetic seal created by sealing the silicon vent hole.

In one or more embodiments, multi-physics numerical simulation is used to study the laser irradiation and melting of the silicon material for optimization of the process parameters to reduce or eliminate the solidified surface asperity. One or more embodiments thereby present novel laser irradiation methods or mechanisms to reduce or eliminate the solidified surface asperity in the IMU fabrication process.

A multi-physics CFD model characterizes the complicated thermal fluid phenomenon in the vent hole sealing process. In one or more embodiments, the model includes a stationary laser irradiation heat source, solid to liquid phase transformation, solidification volume change, surface tension caused by Marangoni flow, evaporation pressure, and/or temperature dependent thermal fluid properties. The geometrical information of an IMU silicon membrane with a vent hole (e.g., the area of interest in FIG. 1B) may also be included.

A validation simulation for the CFD model may be performed using one or more of the following process conditions: (1) laser irradiation power to material surface; (2) silicon membrane thickness; (3) membrane temperature; and (4) vent hole diameter, 10 μm. The laser irradiation power to material surface may be 15 to 500 W. The silicon membrane thickness may be in the range of 50 to 300 μm. The vent hole diameter may be 4 to 25 μm.

Figure 3A:
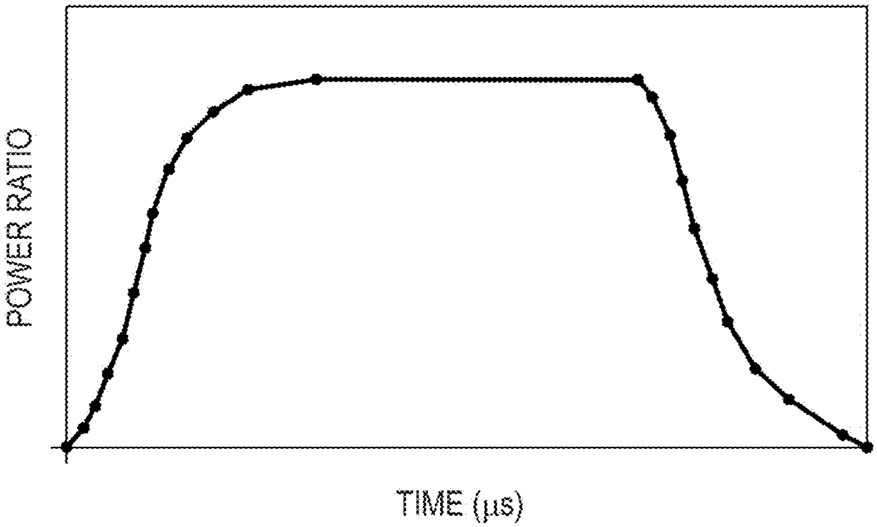
FIG. 3A is a graph plotting power ratio to time (μs) to depict laser pulse duration (i.e., the length of the top of the curve).
Figure 3B:
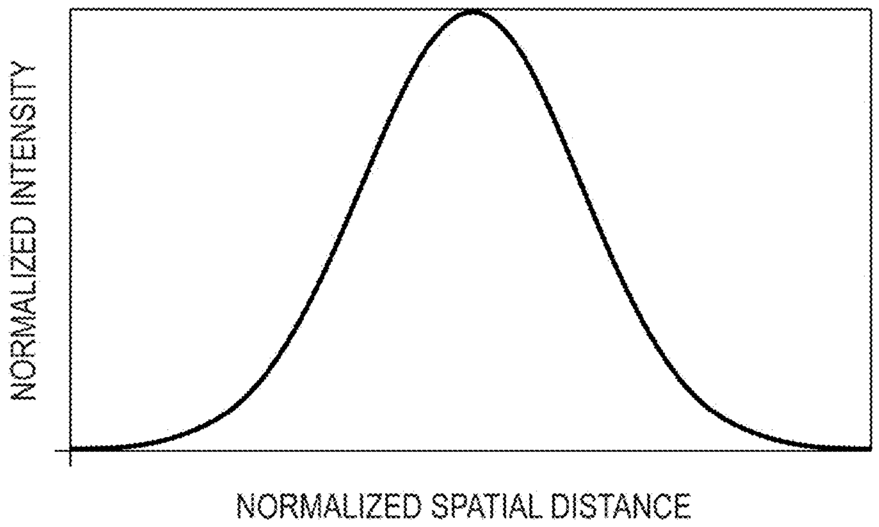
FIG. 3B is a graph depicting a Gaussian distribution of laser intensity.

FIGS. 3A and 3B depict laser irradiation characteristics collected from laser sealing equipment. FIG. 3A is a graph plotting power ratio to time (μs) to depict laser pulse duration (i.e., the length of the top of the curve). FIG. 3B is a graph plotting normalized intensity as a function of normalized spatial distance. FIG. 3B is a graph depicting a gaussian distribution of laser intensity.

Figure 4A:
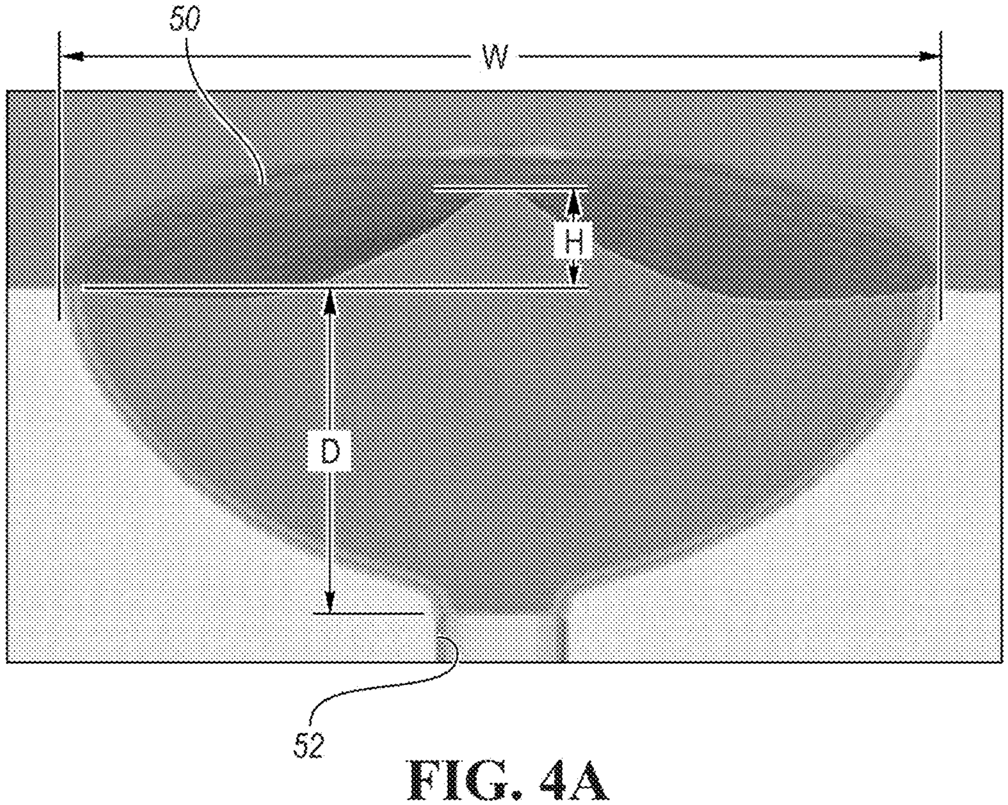
FIG. 4A depicts an image of a vent hole seal using a computational fluid dynamics (CFD) model simulation.
Figure 4B:
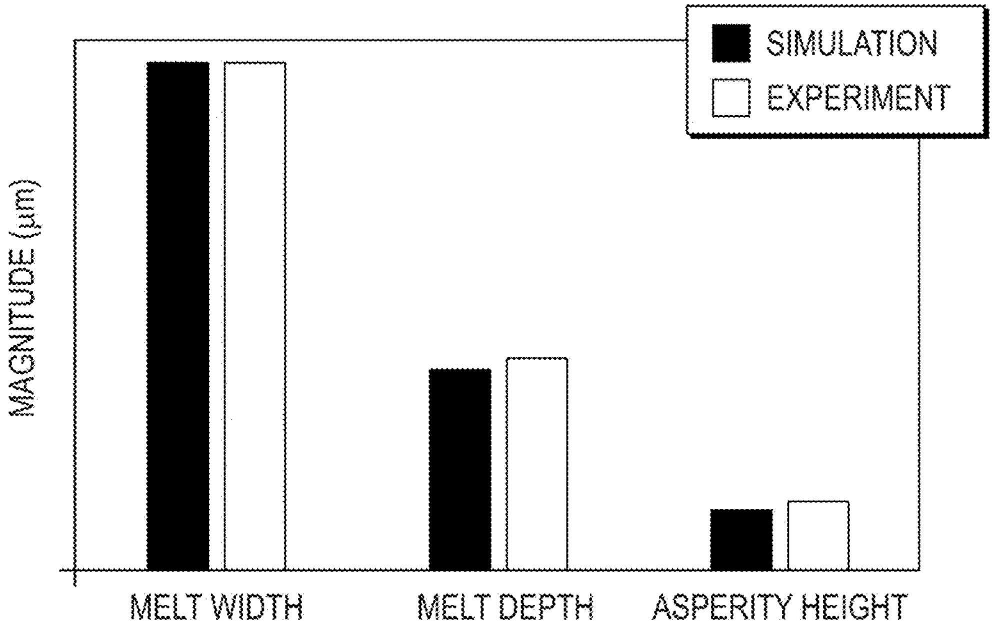
FIG. 4B depicts a comparison of magnitude (μm) for the simulation results and experimental results for melt depth, melt width, and asperity height.

FIG. 4A depicts an image of vent hole seal 50 using a CFD model simulation of an embodiment. Vent hole seal 50 includes seals vent hole 52. Vent hole seal 50 includes melt depth D, melt width W, and asperity height H. FIG. 4B depicts a comparison of magnitude (μm) for the simulation results and experimental results for melt depth, melt width and asperity height. As shown in FIG. 4B, the simulation solidification characteristics of FIG. 4A have reasonable agreement with the experimental measurements. Based on FIGS. 4A and 4B, the CFD model of one or more embodiments may be used to characterize the formation of a surface asperity in a laser sealing process. The CFD model may be further used to investigate and optimize sealing quality.

Figure 5A:
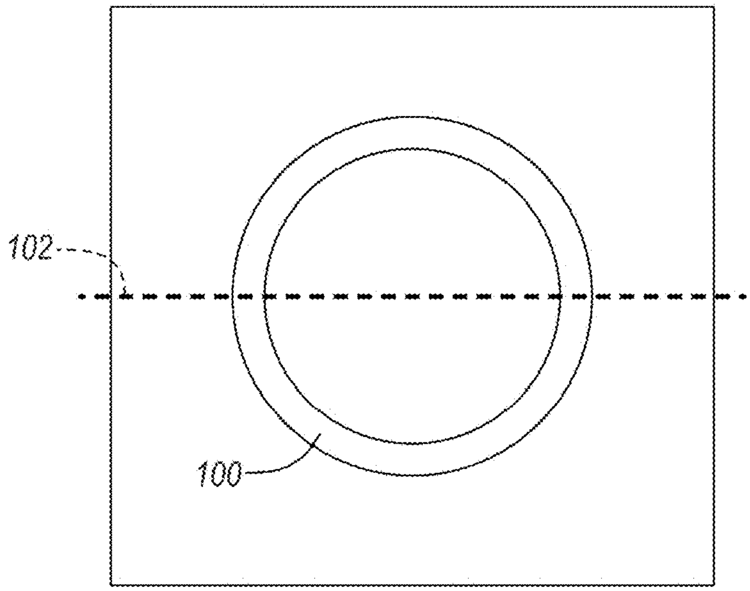
FIG. 5A depicts a plan view of a laser intensity spatial distribution according to one embodiment.
Figure 5B:
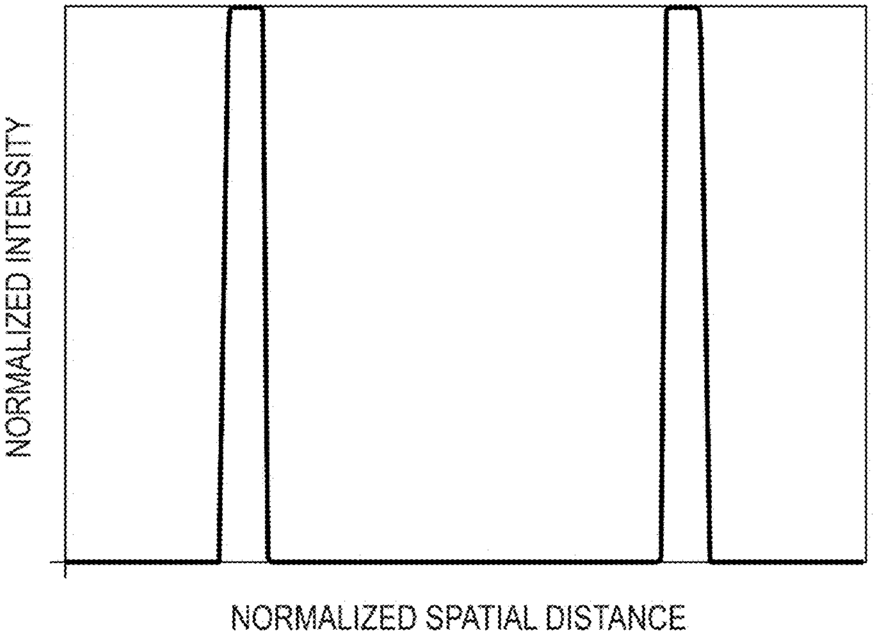
FIG. 5B depicts a graph plotting normalized intensity as a function of normalized spatial distance.

In one or more embodiments, laser irradiation shape and pulse duration may be optimized to reduce surface asperity. The laser irradiation shape may be a donut-shape (e.g., formed between two concentric circles) laser intensity distribution with a rectangular cross section. Figure depicts a plan view of laser intensity spatial distribution 100 according to one embodiment. Dotted line 102 of FIG. 5A represents the normalized spatial distance shown as the x axis in the graph of FIG. 5B and the laser intensity spatial distribution taken along the dotted line 102 of FIG. 5A. In a laser irradiation zone, e.g., a donut-shape formed between two concentric circles, it displays a shape of a rectangular cross-section. The normalized spatial distance is −1 at the left side of dotted line 102 and extends to +1 at the right side of dotted line 102. FIG. 5B depicts a graph plotting normalized intensity as a function of normalized spatial distance. As can be seen, FIG. 5B shows rectangular-shaped intensity between −0.5 and −0.6 and between 0.5 and 0.6.

Figure 5C:
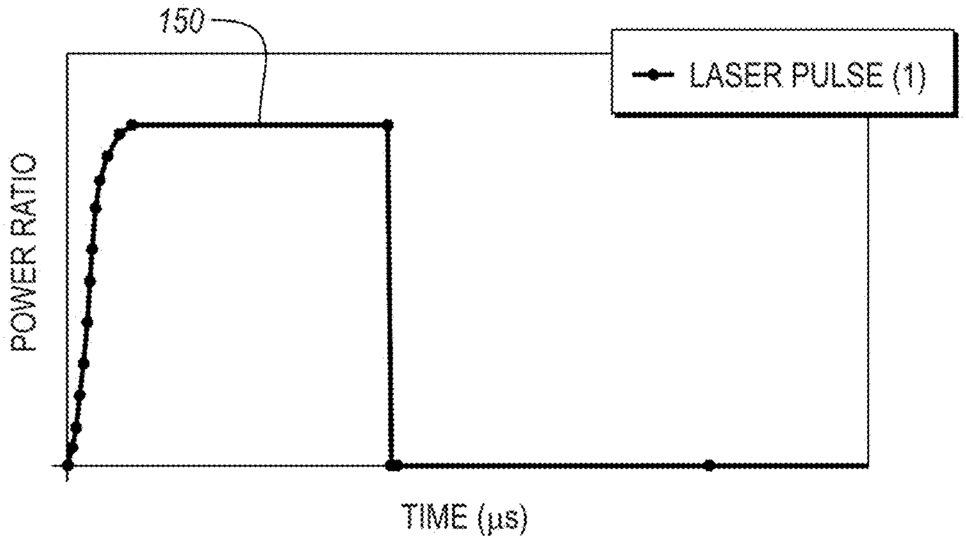
FIGS. 5C and 5D are graphs depicts a laser pulse duration profile for first and second cases with modified laser pulse characteristics.
Figure 5D:
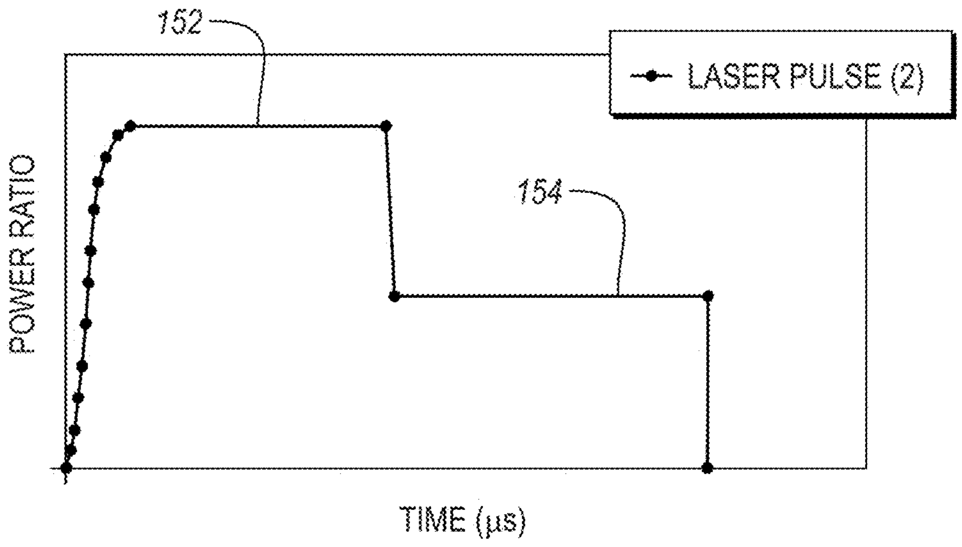

In one or more embodiments, the modification of one or more laser pulse characteristics of the donut-shaped, rectangular cross section laser intensity distribution may result in a reduction in surface asperity. FIGS. 5C and 5D are graphs depicting a laser pulse duration profile for first and second cases with modified laser pulse characteristics. As shown by FIGS. 5C and 5D, while the first and second cases have the same laser pulse duration for primary laser pulses 150 and 152, respectively, the laser intensity distribution of the first and second cases are different where secondary laser pulse 154 has less power.

FIGS. 6A1 and 6A2 depict cross-sectional views of a first material solidification path after the application of a laser heat source according to the first case taken at a first time and a later second time. Dotted line 200 represents a symmetrical center of a vent hole of the first case. Reference numeral 202 represents the vent hole at the first and second times. Region 204 represents a first region above the melting point of the silicon material at the first time. Region 206 represents a second region above the melting point of the silicon material at the second time. Region 208 represents a first region below the melting point of the silicon material at the first time. Region 210 represents a second region below the melting point of the silicon material at the second time. As shown by the arrows in FIGS. 6A1 and 6A2, the second region above the melting point has a smaller area than the first region above the melting point as the silicon material solidifies, and the first region below the melting point has a smaller area than the second region below the melting point as the silicon material solidifies. The arrows represent a solidification path of the silicon material.

FIGS. 6A3 and 6A4 depict cross-sectional views of a second material solidification path after the application of the laser heat source according to the second case taken at a first time and a later second time. Dotted line 212 represents a symmetrical center of a vent hole of the second case. Reference numeral 214 represents the vent hole at the first and second times. Region 216 represents a first region above the melting point of the silicon material at the first time. Region 218 represents a second region above the melting point of the silicon material at the second time. Region 210 represents a first region below the melting point of the silicon material at the first time. Region 212 represents a second region below the melting point of the silicon material at the second time. As shown by the arrows in FIGS. 6A1 and 6A2, the second region above the melting point has a smaller area than the first region above the melting point as the silicon material solidifies, and the first region below the melting point has a smaller area than the second region below the melting point as the silicon material solidifies. The arrows represent a solidification path of the silicon material.

From FIGS. 6A1, 6A2, 6A3, and 6A4, it is observed that the first case follows an outside to center solidification path relative to the top surface of the silicon material while the second case follows a center to outside solidification path relative to the top surface of the silicon material. The energy input from the secondary laser pulse contributes to the change in solidification path of the second case. The addition of the secondary laser pulse input creates a high temperature zone around a melt pool periphery that forces the melt pool periphery zone to cool slower than the center zone. The different types of solidification paths of the first and second cases lead to completely different surface morphologies. Surface peak 224 of FIG. 6A2 of the first case is substantially reduced as shown by FIG. 6A4 of the second case. The substantial reduction may be in a range of 20% to 90%.

FIG. 6B1 depicts a magnified, cross-sectional view of the first material solidification path after solidification according to the first case taken at a third time. FIG. 6B2 depicts a cross-sectional, perspective view of the first material solidification path after the application of the laser heat source according to the first case taken at the third time. Region 226 of FIGS. 6B1 and 6B2 is a melted and fully solidified zone (e.g., the materials go through the entire melting and solidification process). Region 228 of FIG. 6B1 shows a portion of the fully solidified zone that represents a first surface asperity. FIG. 6B3 depicts a magnified, cross-sectional view of the second material solidification path after solidification according to the second case taken at the third time. FIG. 6B4 depicts a cross-sectional, perspective view of the second material solidification path after the application of the laser heat source according to the second case taken at the third time. Region 230 of FIGS. 6B3 and 6B4 is a melted and fully solidified zone. Region 232 of FIG. 6B3 shows a portion of the fully solidified zone that represents a second surface asperity. The height of the second surface asperity is significantly less than the height of the first surface asperity.

Figure 7A:
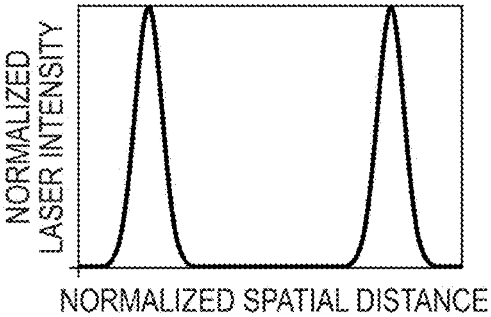
FIG. 7A depicts a graph plotting normalized intensity as a function of normalized spatial distance.

In another embodiment, the laser irradiation shape may be a donut-shape laser intensity distribution with a Gaussian cross-section. FIG. 7A depicts a graph plotting normalized intensity as a function of normalized spatial distance. As can be seen, FIG. 7A shows Gaussian-shaped cross section between about −0.9 and −0.4 and between about 0.4 and 0.9. FIG. 7A shows a normal distribution of normalized laser intensity with respect to each Gaussian-shaped cross section.

In one or more embodiments, the modification of one or more laser pulse characteristics of the donut-shaped, Gaussian cross-section laser intensity distribution may result in a reduction in surface asperity. FIGS. 7B and 7C are graphs depicting the laser pulse duration profile for first and second cases with modified laser pulse characteristics. As shown by FIGS. 7B and 7C, while the first case only uses a primary laser pulse whereas the second case uses a secondary laser pulse with less power than the primary laser pulse.

Figure 7D:
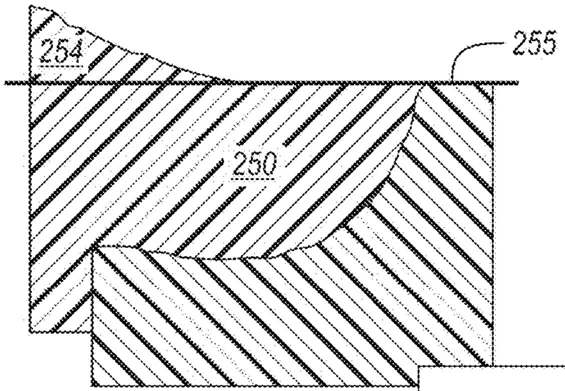
FIG. 7D depicts a magnified, cross-sectional view of a first material solidification path after solidification according to the first case taken at a first time.
Figure 7B:
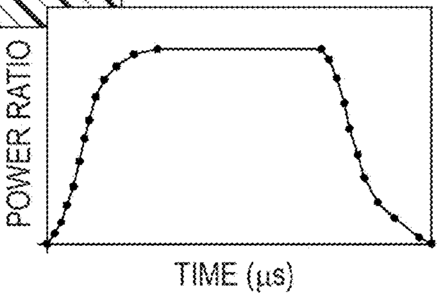
FIGS. 7B and 7C are graphs depicting the laser pulse duration profile for first and second cases with modified laser pulse characteristics.
Figure 7E:
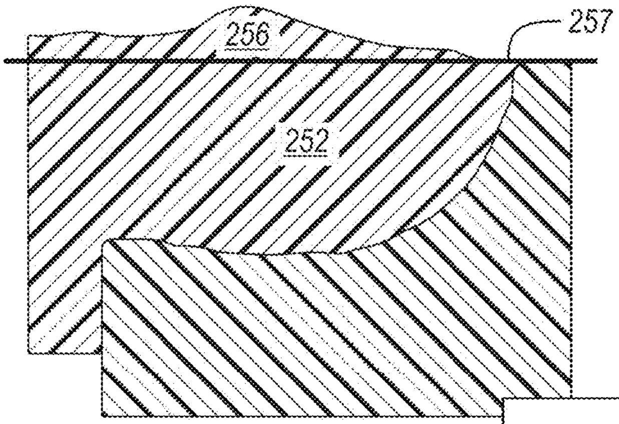
FIG. 7E depicts a magnified, cross-sectional view of a second material solidification after solidification according to the second case taken at the first time.
Figure 7C:
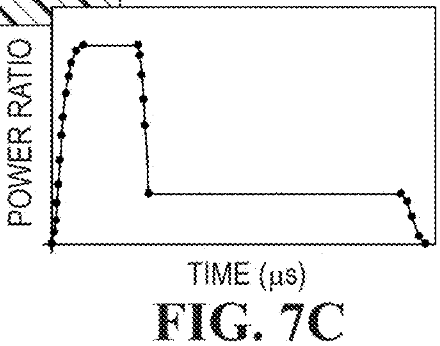

FIG. 7D depicts a magnified, cross-sectional view of a first material solidification path after solidification according to the first case taken at a first time. FIG. 7E depicts a magnified, cross-sectional view of a second material solidification path after solidification according to the second case taken at the first time. Region 250 of FIG. 7D is a melted and fully solidified zone (e.g., the materials go through the entire melting and solidification process) of the first case. Region 252 of FIG. 7E is a melted and fully solidified zone of the second case. Region 254 of FIG. 7D shows a portion of the fully solidified zone that represents a first surface asperity (i.e., the region above line 255). Region 256 of FIG. 7E shows a portion of the fully solidified zone that represents a second surface asperity (i.e., the region above line 257). The heigh of the second surface asperity is significantly less than the height of the first surface asperity. The significant reduction may be in a range of 20% to 90%.

Figure 8A:
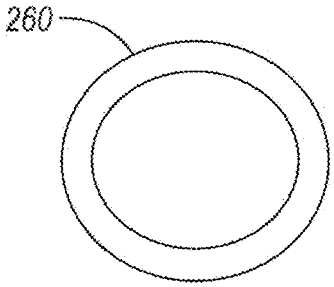
FIG. 8A depicts a plan view of a laser intensity spatial distribution having an oval shape (e.g., formed between two concentric ovals) with a rectangular cross section.
Figure 8B:
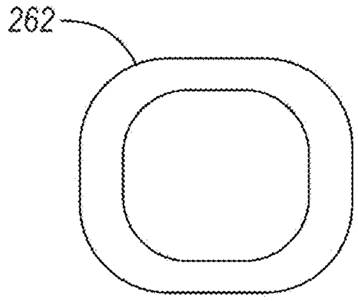
FIG. 8B depicts a plan view of a laser intensity spatial distribution having a square shape with rounded edges.
Figure 8C:
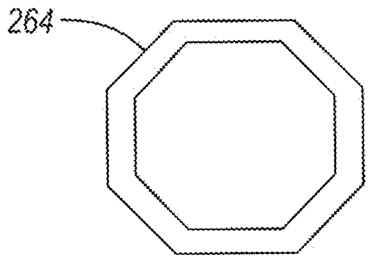
FIG. 8C depicts a plan view of a laser intensity spatial distribution having an octagon shape.

While FIG. 5A depicts a donut-shaped laser intensity distribution configured to reduce surface asperity, one or more other embodiments may include different laser intensity distribution shapes. FIG. 8A depicts a plan view of laser intensity spatial distribution 260 having an oval shape (e.g., formed between two concentric ovals) with a rectangular cross section. The oval shape has a major axis and a minor axis. In one or more embodiments, the length of the major axis and the length of the minor axis differ by one of the following values or in a range of two of the following values: 1, 2, 3, 4, 5, 6, 7, 8, 9, 10, 11, 12, 13, 14, 15, 16, 17, 18, 19, or 20%. FIG. 8B depicts a plan view of laser intensity spatial distribution 262 having a square shape with rounded edges. Other rectangular shapes are contemplated in one or more embodiments. Other polygons may also be used as the shape for the laser intensity spatial distribution. For instance, FIG. 8C depicts a plan view of laser intensity spatial distribution 264 having an octagon shape. The shaded areas on FIGS. 8A, 8B, and 8C indicate the laser energy.

Figure 8D:
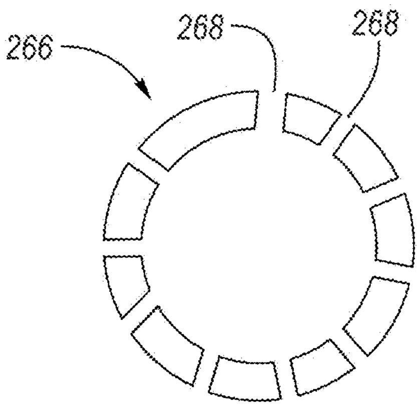
FIG. 8D depicts a plan view of laser intensity spatial distribution having spaced apart discontinuities in a peripheral direction.
Figure 8E:
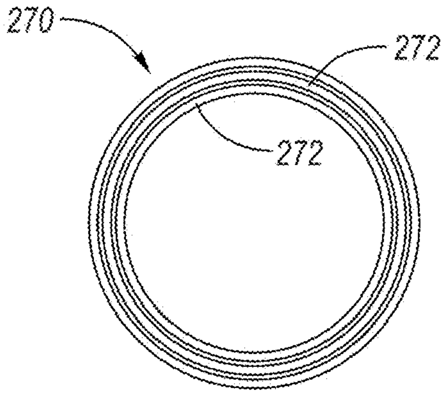
FIG. 8E depicts a plan view of a laser intensity spatial distribution having spaced apart discontinuities in a radial direction.
Figure 8F:
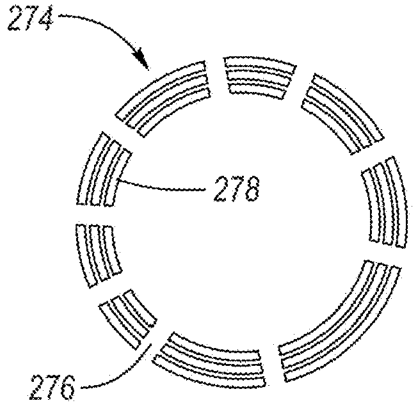
FIG. 8F depicts a plan view of a laser intensity spatial distribution having spaced apart peripheral discontinuities and spaced apart radial discontinuities.

While FIGS. 5A, 8A, 8B, and 8C, depict continuous distributions of laser energy, in other embodiments, the distribution of laser energy may be discontinuous. FIGS. 8D, 8E, and 8F depict discontinuous distributions of laser energy in accordance with one or more embodiments. FIG. 8D depicts a plan view of laser intensity spatial distribution 266 having spaced apart discontinuities 268 in a peripheral direction. The spaced apart discontinuities 268 may be equally spaced apart; orderly, unequally spaced apart; randomly, unequally spaced apart, or a combination thereof. FIG. 8E depicts a plan view of laser intensity spatial distribution 270 having spaced apart discontinuities 272 in a radial direction. The spaced apart discontinuities 272 may be equally spaced apart; orderly, unequally spaced apart; randomly, unequally spaced apart; or a combination thereof. FIG. 8F depicts a plan view of laser intensity spatial distribution 274 having spaced apart peripheral discontinuities 276 and spaced apart radial discontinuities 278. The shaded areas on FIGS. 8D, 8E, and 8F indicate the laser energy. Any of the discontinuous laser energy distributions can be used with any of the laser distribution shapes disclosed in one or more embodiments.

Figure 8G:
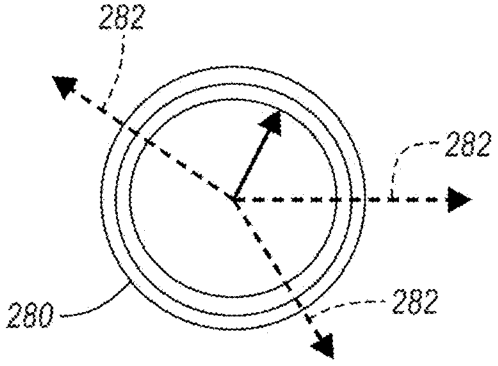
FIG. 8G depicts a top view of a laser intensity spatial distribution with arrows depicting the magnitude of movement in the radial direction.

In one or more embodiments, the laser energy spatial distribution is stationary (e.g., stationary in the x, y, and z directions). In other embodiments, the laser energy spatial distributions (e.g., the primary and/or secondary pulses) may have movement (e.g., radial movement in the x and y directions). The movement distance may be confined to an offset percentage relative to a measurement of the laser distribution shape. For instance, the movement distance may be an offset percentage of one of the following values or in a range of any two of the following values: 1, 2, 3, 4, 6, 7, 8, 9, and 10%. For example, the movement distance may be equal to or less than 10% of a laser donut radius. FIG. 8G depicts a top view of laser intensity spatial distribution 280 with arrows 282 depict the magnitude of movement in the radial direction.

Figure 9A:
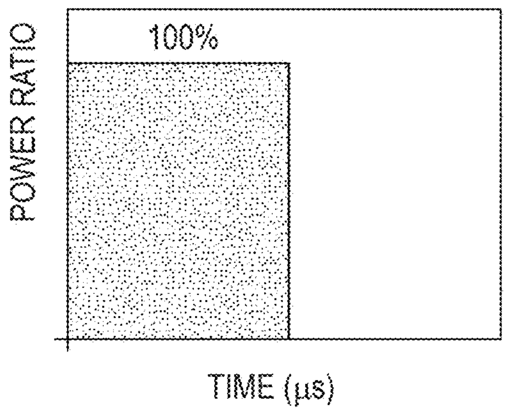
FIGS. 9A, 9B, and 9C depict graphs plotting power ration as a function of time (μs) of first, second, and third cases relating to separated laser pulses for reducing asperity.
Figure 9B:
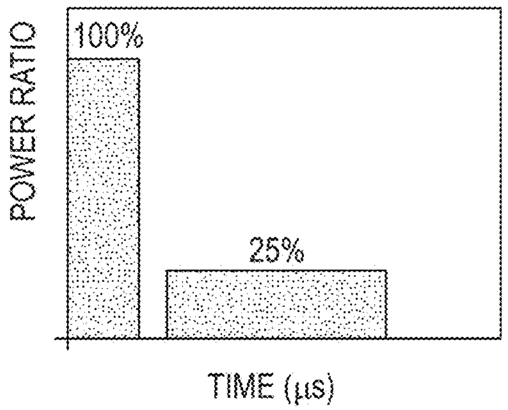
Figure 9C:
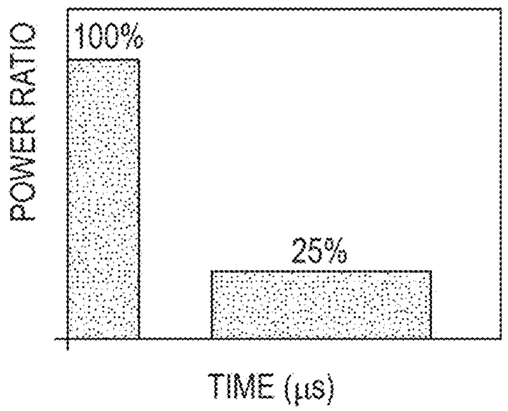

One or more of the above embodiments demonstrate cases where a continuous laser pulse with defined primary and secondary pulse regions promotes a reduction in asperity. In another embodiment, two or more separated laser pulses may reduce asperity. Any of the laser spatial distribution shapes and continuities/discontinuities may be applied to embodiments where two or more separated laser pulses are utilized. FIGS. 9A, 9B, and 9C depict graphs plotting power ratio as a function of time (μs) of first, second, and third cases relating to separated laser pulses for reducing asperity. FIG. 9A shows a primary pulse region and no secondary pulse region. FIG. 9B shows a primary pulse region and a secondary pulse region with a first gap therebetween. As shown in FIG. 9B, the primary pulse region has a shorter duration than the secondary pulse region, and the primary pulse region has a higher power than the secondary pulse region. FIG. 9C shows a primary pulse region and a second gap therebetween. As shown in FIG. 9C, the primary pulse region has a shorter duration than the secondary pulse region, and the primary pulse region has a higher power than the secondary pulse region. The second gap is longer than the first gap.

Figure 10A:
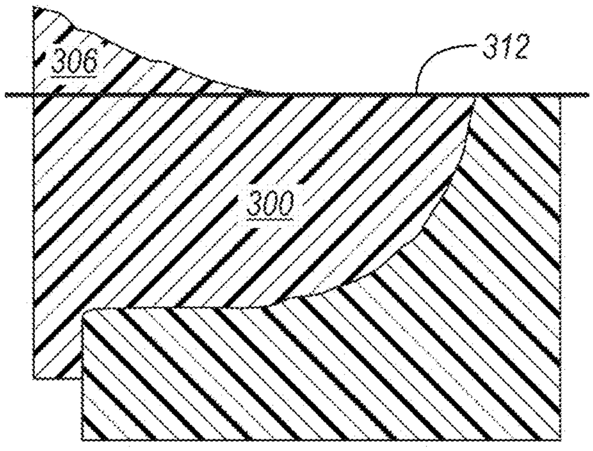
FIGS. 10A, 10B, and 10C depict magnified, cross-sectional views of a first, second, and third solidifications of a silicon material according to first, second, and third cases, respectively, taken at a first time.
Figure 10B:
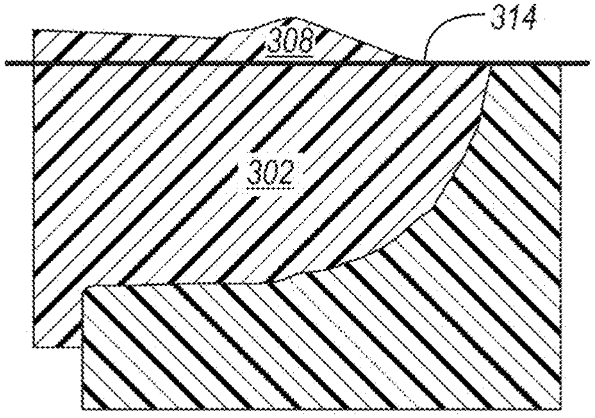
Figure 10C:
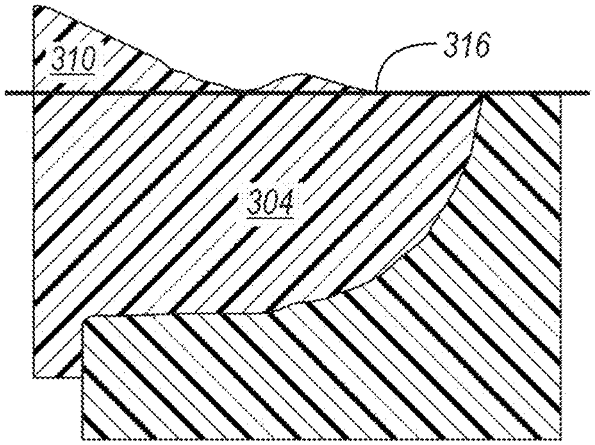

FIGS. 10A, 10B, and 10C depict magnified, cross-sectional views of a first, second, and third solidifications of a silicon material according to the first, second, and third cases, respectively, taken at a first time. Region 300 of FIG. 10A is a melted and fully solidified zone (e.g., the materials go through the entire melting and solidification process) of the first case. Region 302 of FIG. 10B is a melted and fully solidified zone of the second case. Region 304 of FIG. 10C is a melted and fully solidified zone of the third case. Region 306 of FIG. 10A shows a portion of the fully solidified zone representing a first surface asperity (i.e., the region above line 312). Region 308 of FIG. 10B shows a portion of the fully solidified zone representing a second surface asperity (i.e., the region above 314). Region 310 of FIG. 10C shows a portion of the fully solidified zone representing a third surface asperity. The height of the second surface asperity may be significantly less than the heights of the first and third surface asperity. The significant reduction may be in a range of 20% to 90%.

As can be seen by FIGS. 10B and 10C, a secondary pulse region separated from a primary pulse region reduces the height of the surface asperity. However, the time gap shown in FIG. 9B is less than the time gap shown in FIG. 10C and the time gap of FIG. 10B is more favorable to reducing surface asperity than the time gap of FIG. 10C. In one or more embodiments, the time gap between the primary laser pulse and the secondary laser pulse is carefully selected since a relatively larger time gap may reduce the surface asperity reduction. With reference to the second case shown in FIG. 10B, at the time of initiation of the secondary laser pulse, the secondary laser pulse is applied within a molten zone of the silicon material. With reference to the third case shown in FIG. 10C, due to a longer cooling period (e.g., at least two times longer), at the time of initiation of the secondary laser pulse, the secondary laser pulse is applied within a resolidified zone of the silicon material. Therefore, it has minimal effect on an asperity height reduction.

Figure 11A:
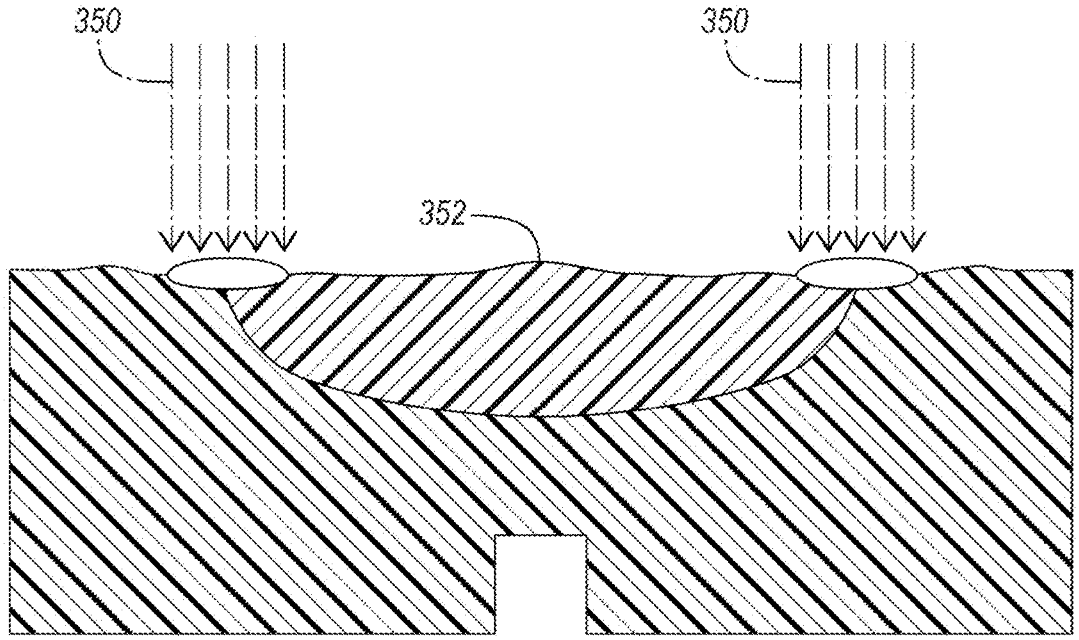
FIGS. 11A and 11B depict views of the locations of the secondary laser pulses at the time of their initiations for the second and third cases.
Figure 11B:
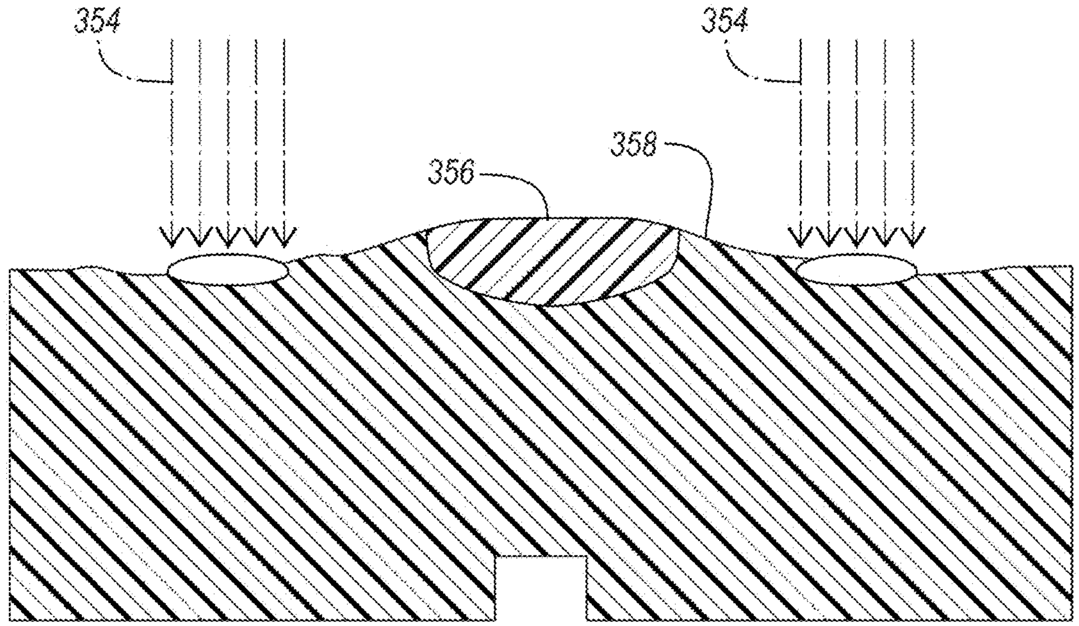

FIGS. 11A and 11B depict views of the locations of the secondary laser pulses at the time of their initiations for the second and third cases. As shown in FIG. 11A and relating to the second case, at the time of initiation of secondary laser pulse 350, secondary laser pulse 350 is applied within molten zone 352 of the silicon material. The laser irradiation location is at the edges of molten zone 352 thereby moving molten material from the center to the edges of molten zone 352. This movement of molten material reduces surface asperity. As shown in FIG. 11B and relating to the third case, at the time of initiation of secondary laser pulse 354, secondary laser pulse 354 is applied outside of molten zone 356, but instead in a resolidified zone. This not only does not reduce asperity through irradiation of a molten region, but it may also cause creation of other surface asperity at the locations of secondary laser pulse 354 outside of molten zone 356.

The time gap may also be expressed as a ratio between the duration of the primary laser pulse and the time gap. In one or more embodiments, the ratio of the time gap to the primary laser pulse duration may be any of the following ratios or in a range of any two of the following ratios: 0.01:1, 0.1:1, 0.2:1, 0.3:1, 0.4:1, 0.5:1, and 0.6:1. As another ratio relevant to one or more embodiments, the ratio of the secondary laser pulse to the primary laser pulse may be any of the following ratios or in a range of any two of the following ratios: 8:1, 7:1, 6:1, 5:1, 4:1, 3:1, 2.5:1, or 2:1.

Figure 12A:
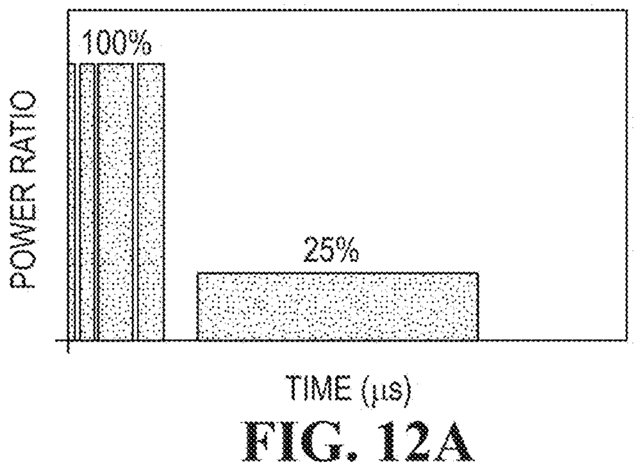
FIGS. 12A, 12B, 12C, 12D, 12E, and 12F depict graphs plotting power ratio as a function of time (μs) of first, second, third, fourth, fifth, and sixth cases, respectively, relating to laser pulses with multiple laser pulse regions (e.g., 2 or more) to reduce surface asperity.
Figure 12B:
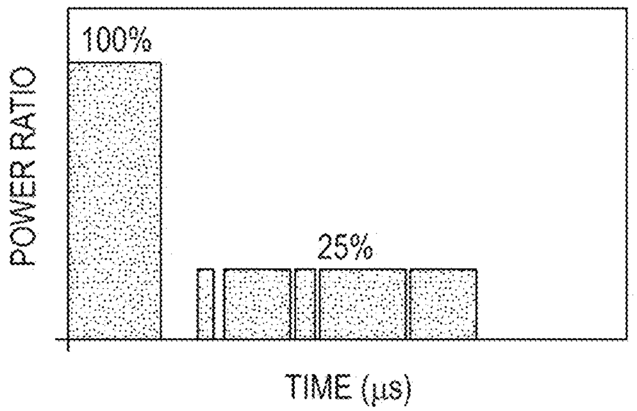
Figure 12C:
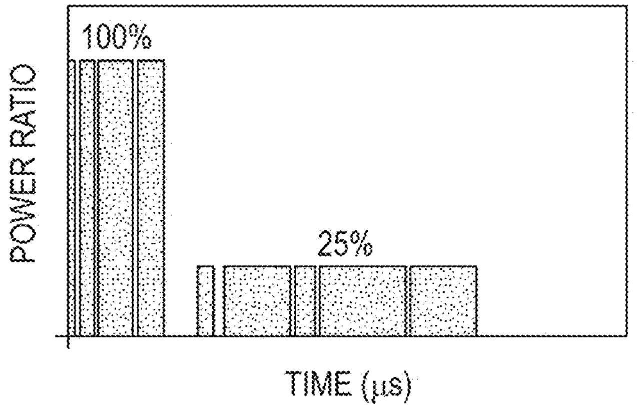

In one or more embodiments, multiple continuous or discontinuous laser pulses with defined pulse regions (e.g., 2 or more) may be used to reduce surface asperity. FIGS. 12A, 12B, 12C, 12D, 12E, and 12F depict graphs plotting power ratio as a function of time (μs) of first, second, third, fourth, fifth, and sixth cases, respectively, relating to laser pulses with multiple pulse regions (e.g., 2 or more) to reduce surface asperity. In one embodiment, a primary laser pulse region may include multiple discrete laser pulses with the same laser power (e.g., 100% laser power) with a relatively short time gap (e.g., about 1% to 2% per time gap relative to the entire duration of the primary laser pulse region) between consecutive laser pulses. The multiple discrete laser pulses may also have different durations. FIG. 12A shows a primary laser pulse region having multiple discreet laser pulses. In another embodiment, a secondary laser pulse region may include multiple discrete laser pulses with the same laser power (e.g., 25% laser power) or different laser powers with a relatively short time gap (e.g., about 1% to 2% per time gap relative to the entire duration of the secondary laser pulse region) between consecutive laser pulses. FIG. 12B shows a secondary laser pulse region having multiple discreet laser pulses. In yet another embodiment, both the primary and secondary laser pulse regions may have multiple discreet laser pulses, as shown, for example, in FIG. 12C.

Figure 12D:
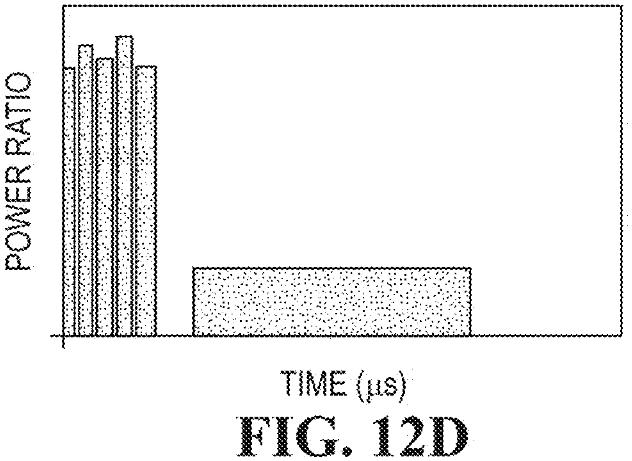
Figure 12E:
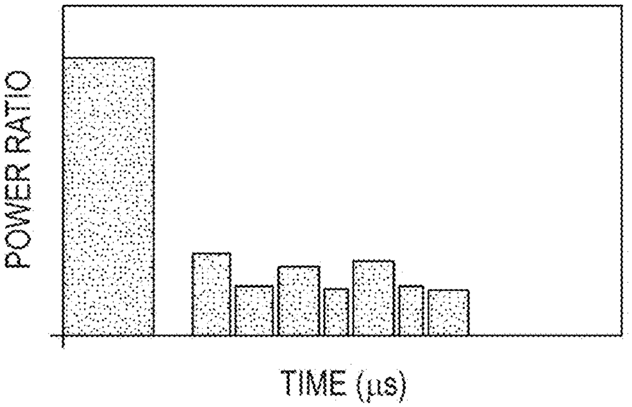
Figure 12F:
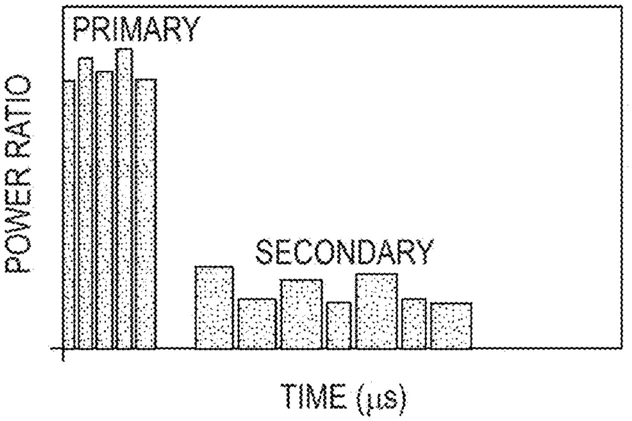

In certain embodiments, the multiple discrete laser pulses may have different laser power levels and/or durations. FIG. 12D shows a primary laser pulse region including multiple discreet laser pulses having varying power levels. FIG. 12E shows a secondary laser pulse region including multiple discrete laser pulses having varying power levels. FIG. 12F shows both the primary and secondary laser pulse regions having multiple discrete laser pulses having varying power levels. The laser power level variance may vary by any of the following values or in a range of any two of the following values: 0, 1, 2, 3, 4, 5, 6, 7, 8, 9, 10, 11, 12, 13, 14, 15, 16, 17, 18, 19, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, and 60%.

In one or more embodiments, a variable vent hole diameter can be used to mitigate surface asperity. A variable vent hole diameter may be utilized with the second case disclosed herein in connection with FIG. 5D where the laser pulse is donut-shaped with primary and secondary pulses. Any of the continuous or discontinuous, shaped laser distributions may be used in accordance with the variable vent hole diameter embodiments.

Figure 13A:
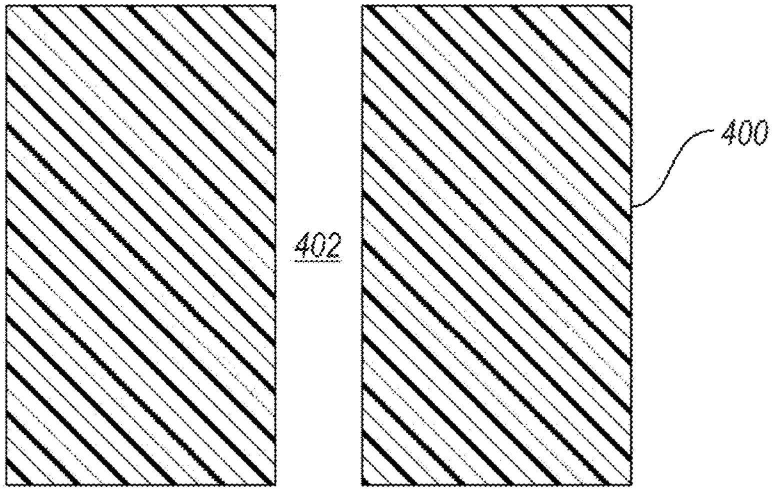
FIG. 13A depicts a membrane material defining a vent hole having a constant diameter along a length of the vent hole.
Figure 13B:
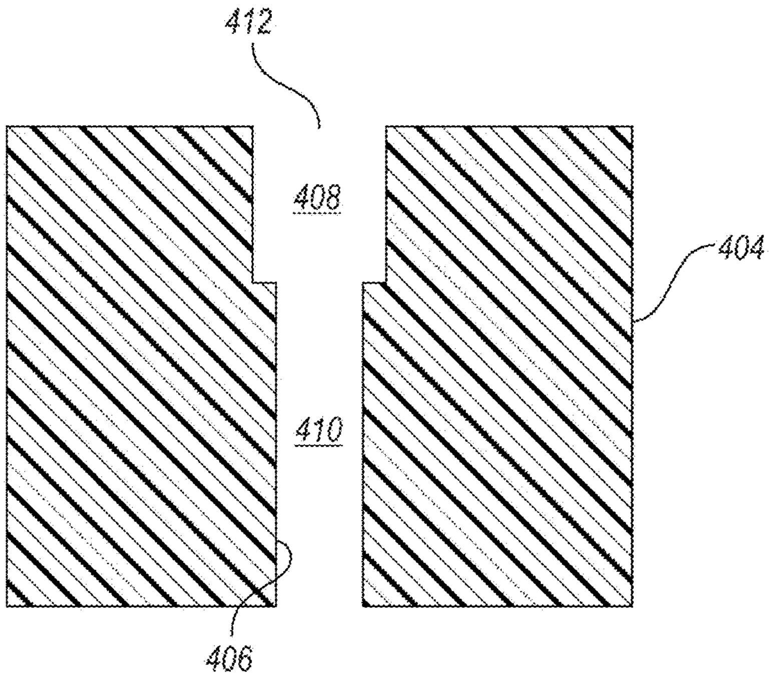
FIG. 13B depicts a membrane material defining a vent hole having a variable diameter along a length of the vent hole.

FIGS. 13A and 13B depict schematic views of first and second cases of vent holes in connection with laser sealing of silicon membranes. FIG. 13A depicts membrane material 400 defining vent hole 402 having a constant diameter along the length of vent hole 402. FIG. 13B depicts membrane material 404 defining vent hole 406 having a variable diameter along the length of vent hole 408. Vent hole 406 includes first diameter section 408 and second diameter section 410. First diameter section 408 extends between vent hole opening 412 and second diameter section 410. Second diameter section 410 extends between first diameter section 408 and device chamber (not shown). The transition between first diameter section 408 and second diameter section 410 forms a shoulder section 414, which is cylindrical and shape and has a width of the difference between the diameters of the first and second diameter sections 408 and 410. The first diameter section 408 is greater than the second diameter section 410 by a percentage. The percentage may be any of the following values or in a range of any two of the following values: 30%, 35%, 40%, 45%, 50%, and 55%. The length of first diameter section 408 may be equal to the diameter of first diameter section 408. In another embodiment, the enlarged section of the vent hole may taper from the larger diameter to a diameter of the base diameter vent hole portion.

Figure 14A:
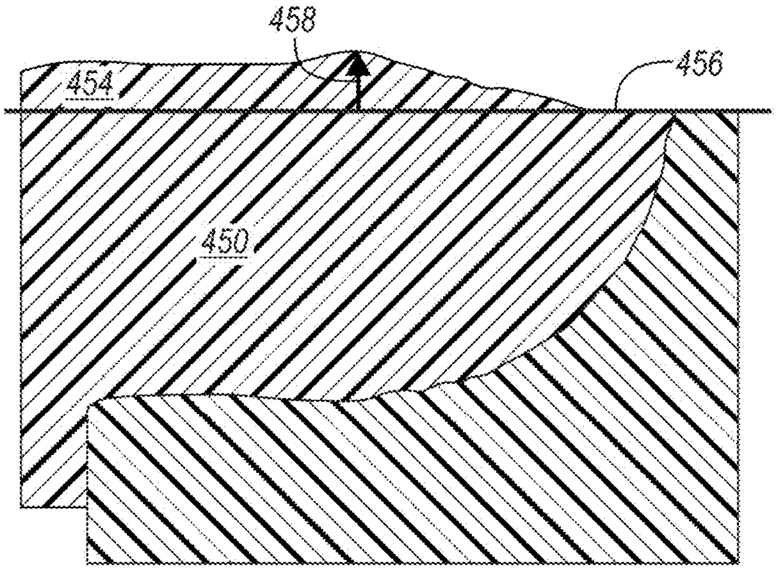
FIGS. 14A and 14B depict magnified, cross-sectional views of a first and second solidification of a silicon membrane according to the first and second cases of FIGS. 13A and 13B, respectively, showing that a variable diameter vent hole reduces surface asperity.
Figure 14B:
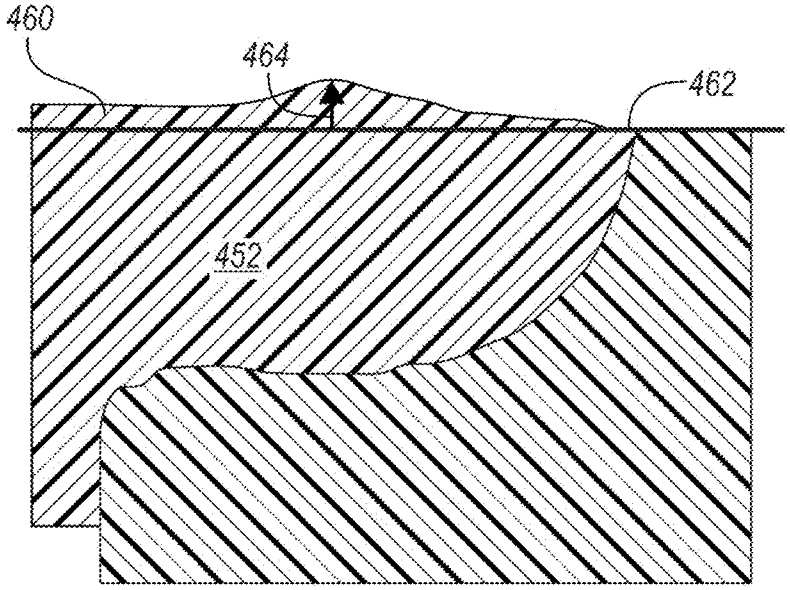

FIGS. 14A and 14B depict magnified, cross-sectional views of a first and second solidification of a silicon membrane according to the first and second cases of FIGS. 13A and 13B, respectively, showing that a variable diameter vent hole reduces surface asperity. Region 450 of FIG. 14A is a melted and fully solidified zone (e.g., the materials go through the entire melting and solidification process) of the first case. Region 452 of FIG. 14B is a melted and fully solidified zone of the second case. Region 454 of FIG. 14A shows a portion of the fully solidified zone representing a first surface asperity (i.e., the region above line 456 with a height depicted by arrow 458). Region 460 of FIG. 14B shows a portion of the fully solidified zone representing a second surface asperity (i.e., the region above line 462 with a heigh depicted by arrow 464). The height of the second surface asperity is less than the height of the first surface asperity, thereby supporting that an enlarged diameter portion adjacent the vent hole opening accommodates additional molten material and reduces surface asperity upon solidification. The reduction may be in a range of 15% to 30%.

Figure 15A:
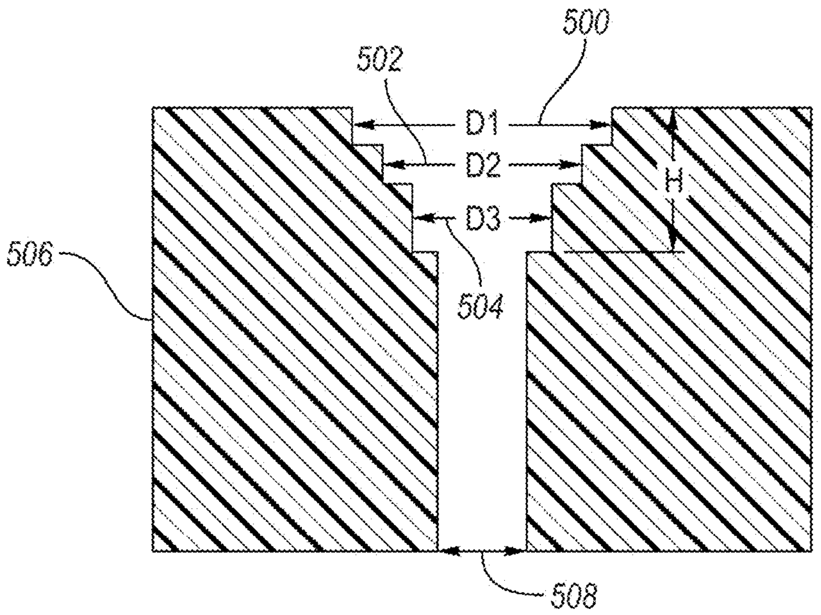
FIG. 15A depicts a cross-sectional view of first, second, and third vent holes having first, second, and third diameters, respectively, in an upper region of a silicon membrane.

In one or more embodiments, two or more vent holes with variable diameters may be applied to reduce surface asperity. FIG. 15A depicts a cross-sectional view of first, second, and third vent holes 500, 502, and 504 having first, second, and third diameters, respectively, in an upper region of silicon membrane 506. First, second, and third vent holes 500, 502, and 504 are configured to create a volume to accommodate solidified material under direct laser irradiation. The first, second, and third diameters may larger than the original vent hole diameter (e.g., diameter 508) by any of the following percentages or in a range of any two of the following percentages: 100, 105, 110, 115, 120, 125, 130, 135, 140, 145, and 150%. The original vent hole diameter may be any of the following values or in a range of any two of the following values: 4, 5, 6, 7, 8, 9, 10, 11, 12, 13, 14, 15, 16, 17, 18, 19, and 20 μm. The total height of all the vent holes may be any of the following values or in a range of any two of the following values: 15, 16, 17, 18, 19, 20, 21, 22, 23, 24, and 25 μm.

Figure 15B:
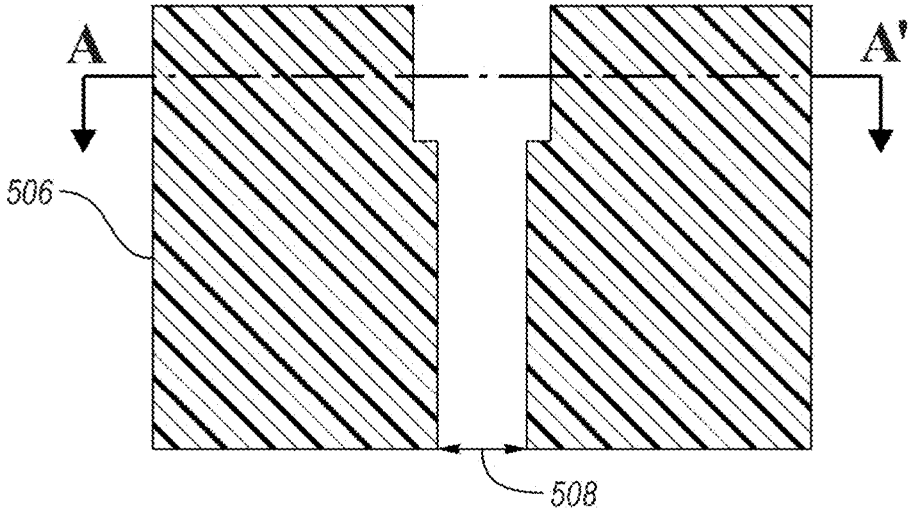
FIG. 15B depicts a cross-section A-A' taken at a height of silicon membrane.
Figure 15C:
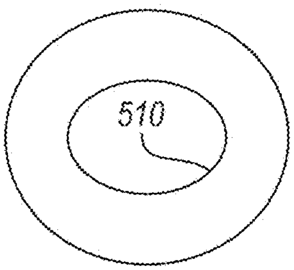
FIGS. 15C, 15D, and 15E depict various A-A' cross-sectional shapes of formed vent holes in accordance with one or more embodiments.
Figure 15D:
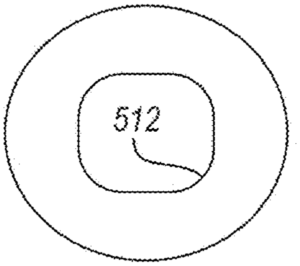
Figure 15E:
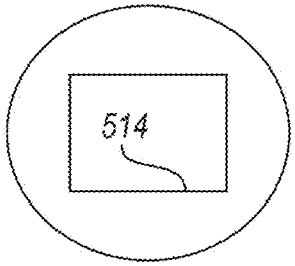

A cross section of a vent hole formed into the silicon membrane at a height of the silicon membrane may have a substantially circular shape. FIG. 15B depicts a cross-section A-A' taken at a height of silicon membrane 506. FIGS. 15C, 15D, and 15E depict various A-A' cross-sectional shapes of formed vent holes in accordance with one or more embodiments. Figure depicts an ovular shape 510 (e.g., a substantially oval shape). FIG. 15D depicts a square shape 512 (e.g., a substantially square shape with rounded corners). FIG. 15E depicts a rectangular shape 514 (e.g., a substantially rectangular shape).

In one or more embodiments, a CFD model is used to simulate a laser silicon membrane sealing process for IMU sensors. The CFD model considered process physics such as surface tension and solidification volume shrinkage. Additionally, the temperature dependent material properties, such as density, conductivity, specific heat, and surface tension coefficient, were considered in the CFD model for accurate simulation.

As shown in one or more embodiments above relating to a continuous laser pulse, a combination of a primary laser pulse and a secondary laser pulse may reduce a surface asperity height. The intensity spatial distribution may be donut-shaped with a rectangular or Gaussian cross-section. The power of the secondary laser power may be lower than the power of the primary laser source by a percentage. The percentage may be in the range of 20% to 60%.

In one or more embodiments utilizing a continuous laser pulse, a supplementary (e.g., secondary) laser pulse may reduce the surface asperity height. The laser intensity spatial distribution can be donut-shaped with a rectangular or a Gaussian cross-section (or other laser shapes as described herein). The supplementary laser power may be lower than the primary laser power, e.g., 10% to 60%.

In one or more embodiments, two separated laser pulses may be utilized where the application of a supplementary laser pulse with an appropriated time gap (the time value between primary and supplementary laser pulses) may help to reduce the surface asperity height. However, the larger the time gap, the smaller the surface asperity height reduction effect. The primary and secondary laser pulses may include several individual laser shots.

In one or more embodiments, a variable vent hole diameter configuration may be utilized to reduce the surface asperity height. In one or more embodiments, multiple vent holes with varying diameters may help to reduce surface asperity, and the vent hole cross-section may not have a perfect circular shape.

The following applications are related to the present application: U.S. Pat. Appl. Ser. No. 17/863,659 filed on Jul. 13, 2022, and U.S. Pat. Appl. Ser. No. 17/863,669 filed on Jul. 13, 2022 which are each incorporated by reference in their entirety herein.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A method for controlling surface asperity during laser sealing of a membrane vent hole, the method comprising:

applying a laser pulse having a laser intensity spatial distribution to the membrane vent hole to form a seal over the membrane vent hole, the laser intensity spatial distribution is an oval shaped intensity distribution or a polygon shaped laser intensity distribution, the laser pulse including a primary laser pulse region and a secondary laser pulse region later in time than the primary laser pulse region, and a time gap between the primary laser pulse region and the secondary laser pulse region, the primary laser pulse region or the secondary laser pulse region includes first and second discontinuous laser pulses having a first time gap therebetween, the primary laser pulse region having a primary pulse duration and the first time gap having a primary pulse duration and the first time gap having a first time gap duration, the first time gap duration is 1% to 2% of the primary pulse duration, the seal having a seal surface having a surface asperity characteristic.

2. The method of claim 1, wherein the first discontinuous pulse having a first discontinuous pulse laser power and the second discontinuous pulse having a second discontinuous pulse laser power, the first and second discontinuous pulse powers are not equal.

3. The method of claim 1, wherein the secondary laser pulse region includes third and fourth discontinuous laser pulses, the secondary laser pulse having a secondary pulse duration and the second time gap having a second time gap duration, the second time gap duration is 1% to 2% of the secondary pulse duration.

4. The method of claim 1, wherein the secondary laser pulse region includes third and fourth discontinuous laser pulses, the third discontinuous pulse having a third discontinuous pulse laser power and the fourth discontinuous pulse having a fourth discontinuous pulse laser power, the third and fourth discontinuous pulse powers are not equal.

5. The method of claim 1, wherein the primary laser pulse region has a primary laser power and the secondary laser pulse region has a secondary laser power, the secondary laser power is less than the primary laser power.

6. The method of claim 5, wherein the secondary laser power is less than the primary laser power by 10% to 60%.

7. The method of claim 1, wherein the surface asperity characteristic is a reduced surface asperity height.

8. A method for controlling surface asperity during laser sealing of a membrane vent hole, the method comprising:

applying a laser pulse having a laser intensity spatial distribution to the membrane vent hole to form a seal over the membrane vent hole, the laser intensity spatial distribution is an oval shaped intensity distribution or a polygon shaped laser intensity distribution, the laser pulse including a primary laser pulse region and a secondary laser pulse region later in time than the primary laser pulse region, and a time gap between the primary laser pulse region and the secondary laser pulse region, the primary laser pulse region having a primary laser power and the secondary laser pulse region having a secondary laser power less than the primary laser power, the primary laser pulse region has a primary pulse duration and the time gap has a time gap duration, a ratio of the time gap duration to the primary pulse duration is 0.01:1 to 0.6:1, the seal having a seal surface having a surface asperity characteristic.

9. The method of claim 8, wherein the ratio of the time gap duration to the primary pulse duration is 0.2:1 to 0.6:1.

10. The method of claim 8, wherein the primary laser pulse region has a primary pulse duration and the secondary laser pulse region has a secondary pulse duration, a ratio of the secondary pulse duration to the primary pulse duration is 8:1 to 2:1.

11. The method of claim 8, wherein the secondary laser power is less than the primary laser power by 10% to 60%.

12. The method of claim 8, wherein the surface asperity characteristic is a reduced surface asperity height.

13. The method of claim 8, wherein the laser intensity spatial distribution has spaced apart discontinuities.

14. The method of claim 13, wherein the laser intensity spatial distribution includes peripheral discontinuities or radial discontinuities.

15. The method of claim 8, wherein the membrane vent hole is a silicon membrane vent hole.

* * * * *